(12) United States Patent
Morales et al.

(10) Patent No.: US 7,798,010 B2
(45) Date of Patent: Sep. 21, 2010

(54) SENSOR GEOMETRY FOR IMPROVED PACKAGE STRESS ISOLATION

(75) Inventors: Gilberto Morales, Arlington, TX (US);
Carl E. Stewart, Plano, TX (US);
Richard A. Davis, Plano, TX (US);
Alistair D. Bradley, Dublin, OH (US)

(73) Assignee: Honeywell International Inc., Morristown, NJ (US)

( * ) Notice: Subject to any disclaimer, the term of this patent is extended or adjusted under 35 U.S.C. 154(b) by 384 days.

(21) Appl. No.: 11/973,966

(22) Filed: Oct. 11, 2007

(65) Prior Publication Data
US 2009/0096040 A1    Apr. 16, 2009

(51) Int. Cl.
*G01L 1/00* (2006.01)
(52) U.S. Cl. .......................................... 73/760
(58) Field of Classification Search .................... 73/760
See application file for complete search history.

(56) References Cited

U.S. PATENT DOCUMENTS

| | | |
|---|---|---|
| 4,680,569 A | 7/1987 | Yamaki et al. |
| 4,800,758 A | 1/1989 | Knecht et al. .................. 73/727 |
| 5,174,156 A | 12/1992 | Johnson et al. ................ 73/715 |
| 5,412,994 A | 5/1995 | Cook et al. ..................... 73/756 |
| 5,621,243 A | 4/1997 | Baba et al. |
| 5,695,590 A * | 12/1997 | Willcox et al. ............ 156/272.2 |
| 5,994,161 A | 11/1999 | Bitko et al. .................... 438/53 |
| 6,768,196 B2 | 7/2004 | Harney et al. ................ 257/729 |
| 6,946,742 B2 | 9/2005 | Karpman ...................... 257/778 |
| 6,993,975 B2 | 2/2006 | Borzabadi et al. ............. 73/754 |

FOREIGN PATENT DOCUMENTS

| JP | 05-275580 A | 10/1993 |
|---|---|---|
| JP | 2006-250702 A | 9/2006 |

* cited by examiner

*Primary Examiner*—Harshad Patel
*Assistant Examiner*—Octavia Davis

(57) ABSTRACT

The sensor geometry for improved package stress isolation is disclosed. A counterbore on the backing plate improves stress isolation properties of the sensor. The counterbore thins the wall of the backing plate maintaining the contact area with the package. The depth and diameter of the counterbore can be adjusted to find geometry for allowing the backing plate to absorb more package stresses. Thinning the wall of the backing plate make it less rigid and allows the backing plate to absorb more of the stresses produced at the interface with the package. The counterbore also keeps a large surface area at the bottom of the backing plate creating a strong bond with the package.

13 Claims, 6 Drawing Sheets

SENSOR GEOMETRY FOR IMPROVED PACKAGE STRESS ISOLATION

TECHNICAL FIELD

Embodiments are generally related to sensing systems and methods. Embodiments are also related to pressure sensing systems such as low-pressure medical sensors. Embodiments are additionally related to sensor geometry for improved package stress isolation.

BACKGROUND OF THE INVENTION

Micro-Electrical-Mechanical-Systems (MEMS) such as sensors can be widely used in applications such as automotive, household appliance, building ventilation, and in general industrial applications to sense a physical condition such as pressure, temperature, or acceleration, and to provide an electrical signal representative of the sensed physical condition. Conventional pressure sensor is constructed as a network of resistors in a resistive bridge configuration, wherein the resistive bridge has two terminals for coupling to power supply potentials and two terminals for providing a differential output signal.

A drawback of resistive bridge type sensor is that they produce a non-zero output electrical signal (i.e., offset voltage) at their output terminals due to package stresses. Temperature Coefficient of Offset (TCO) is a measure of non-pressure induced stresses as a function of temperature that is placed on a semiconductor device such as MEMS device and is expressed in microvolts per degree Celsius.

In one prior art a non-zero TCO in a semiconductor is adjusted by reducing the amount of adhesive material utilized to secure a first structure to a second structure. An adhesive layer utilized to secure a sensor die to a constraint die in a pressure sensor application is reduced in thickness and/or formed so that adhesive material does not completely cover the constraint die. The TCO is further adjusted by reducing the amount and/or patterning the adhesive layer employed to secure the sensor to its package.

In another prior art, a structure and method of making a piezoresistive transducer with reduced offset current are disclosed. The transducer is comprised of a piezoresistive die having a support rim and a diaphragm, and a support housing having a wall and an aperture. The shape of the diaphragm is matched with the shape of the aperture while the shape of the supporting rim is matched with the shape of the wall. By matching these shapes, temperature induced stresses are reduced, thus reducing temperature induced offset currents.

Another prior art includes a stress sensitive microchip on a package with an isolator between the microchip and the package. The isolator has a modulus of elasticity that has a relationship with the package's modulus of elasticity. This relationship causes no more than a negligible thermal stress to be transmitted to the microchip.

Referring to FIG. 1, when a pressure die 102 is attached to a package 101, the Coefficient of Thermal Expansion (CTE) mismatch between the different materials produce package stresses that lead to an offset signal on the pressure die 102. Most of these stresses are produced at the interface between the die 102 and the package 101. Temperature Coefficient of Offset (TCO) can be a non-pressure induced signal as a function of temperature on a pressure sensor. To minimize the TCO a backing plate 103 with a CTE close to Silicon can be placed between the Silicon die 102 and the package. 101. The backing plate 103 isolates the sensing die 102 from the package stresses. The Room Temperature Vulcanizing (RTV) 104 or other die attach material for example having a CTE of 4.4e-5 1/C can be used to attach the backing plate 103 to the package 101. Backing plate 103 can be made of Pyrex, Hoya, Borofloat, Silicon or other material with a CTE close to Silicon's CTE. The packages 101 for example can have a CTE of 1.6e-5 1/C.

Usually the backing plate's thickness 102 is increased to minimize the package stresses on the Silicon die 102. Package size, assembly processes and cost limitations limit the thickening of the backing plate. It is well known in the industry that increasing the backing plate's thickness improves its stress isolation properties. However due to space limitation and electrical connection processes it is often not possible for the thickness to be increased.

Based on the foregoing, it is believed that a need exists to modify the backing plate's geometry for improving the stress isolation without increasing its thickness.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved pressure sensor usable, for example, as low pressure medical sensors.

It is another aspect of the present invention to provide for a sensor geometry for improved package stress isolation.

The present invention utilizes a counterbore on the backing plate to improve its stress isolation. This reduces the backing plate's stiffness and allows it to absorb the stresses from the package. The depth and diameter of the counterbore can be adjusted to find a geometry that allows the backing plate to absorb more of the package stresses. The counterbore thins the wall of the backing plate while maintaining the contact area with the package. Thinning the wall of the backing plate make it less rigid and allows the backing plate to absorb more of the stresses produced at the interface with the package. The counterbore also keeps a large surface area at the bottom of the backing plate where it attaches to the package. The larger surface area enables a strong bond with the package.

A counterbore makes it possible in a sensor package to employ thinner backing plates while minimize package stresses on a Silicon die. Package space constraints limit the total thickness of the Silicon/backing plate. In addition the ability to make robust electrical connections to the die such as wirebonds to a substrate can be made far more difficult with a taller die. The counterbore makes it possible to utilize a thinner backing plate that performs better than a thicker backing plate.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
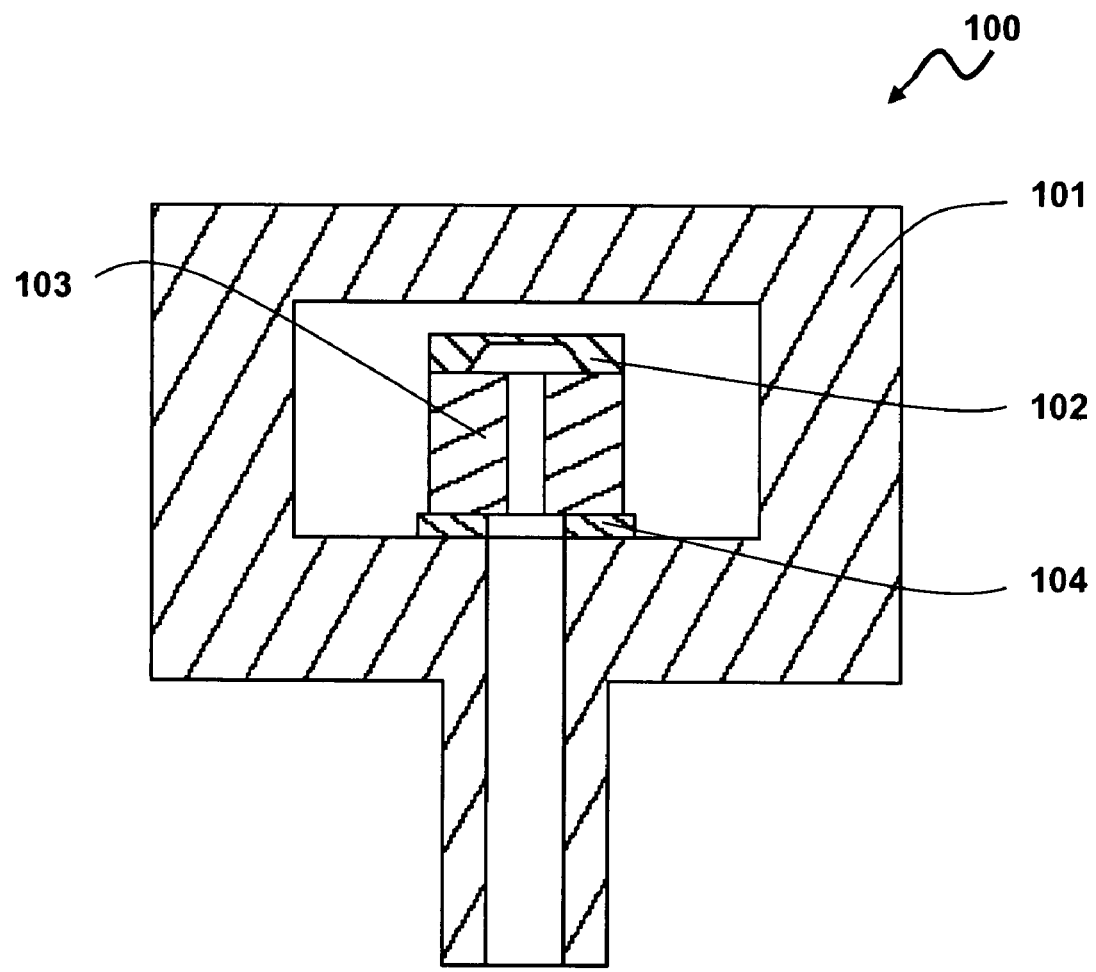
FIG. 1, labeled "prior art", illustrates a prior art representation of side view of a conventional pressure sensor depicting a pressure die on a package.
Figure 2:
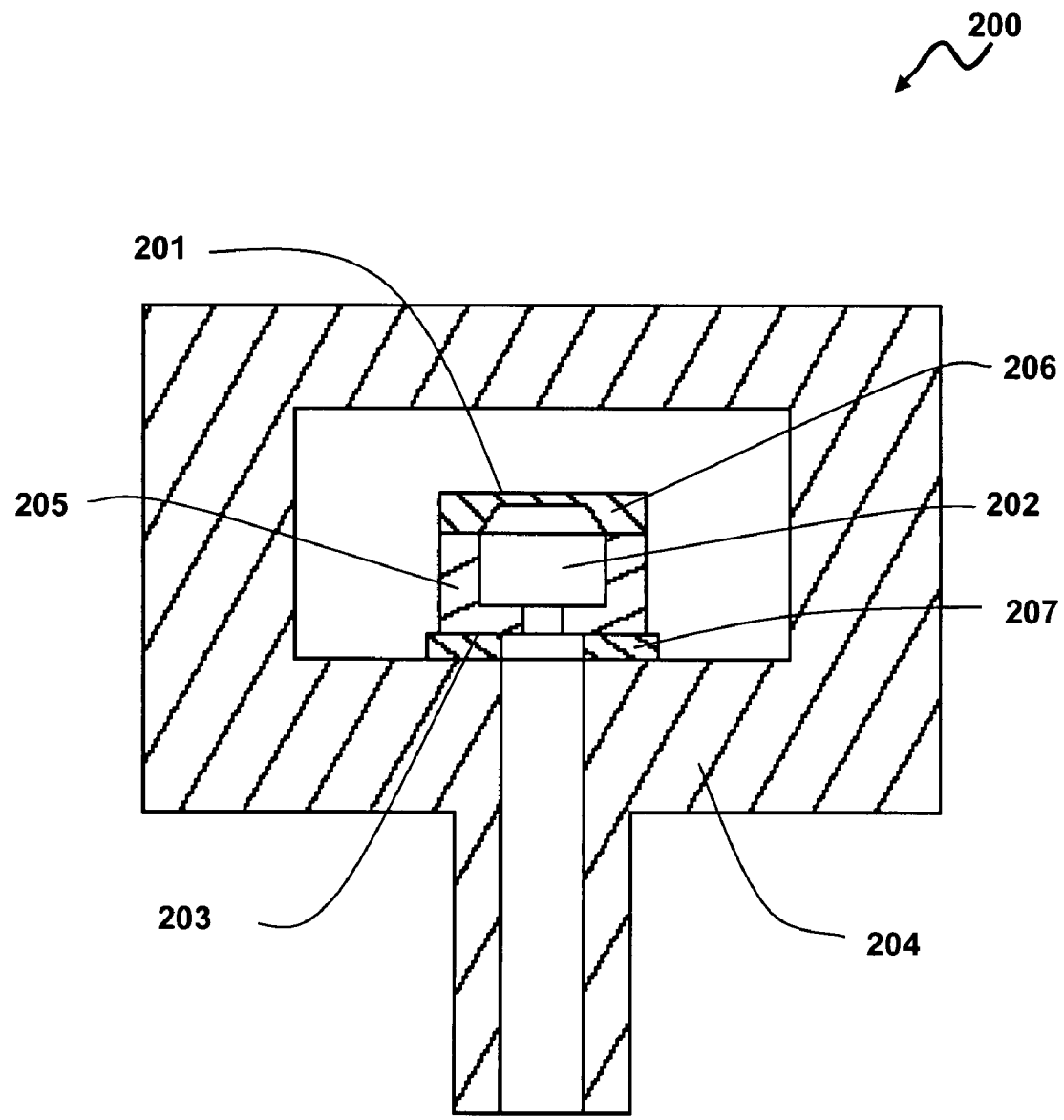
FIG. 2 illustrates a side view of a pressure sensor depicting counterbore on the backing plate to improve backing plate stress isolation on a sense die, which can be implemented in accordance with a preferred embodiment.

FIG. 2 illustrates a side view of a pressure sensor 200 depicting counterbore 202 on the backing plate 205 to improve backing plate stress isolation, which can be implemented in accordance with a preferred embodiment. The pressure sensor 200 is attached to the package 204 with die attach material 207. Most of the thermal stresses on the die 206 are produced at the interface 203 with the package 204. A backing plate 205 with a CTE close to Silicon is typically placed between the package 204 and the die 206 to isolate the die 206 from the package stresses.

The backing plate 205 is typically made of materials such as Silicon, Pyrex, Hoya or Borofloat. A well-known technique to improve the backing plate's stress isolation is to make it thicker. A thicker backing plate 205 puts the piezoresistors 201 farther away from the source of most of the package stresses. FIG. 2 also shows that the package 204 limits the thickness of the backing plate 205. The counterbore 202 technique provides another way to improve the backing plate's 205 stress isolation. Without increasing the backing plate's thickness the stress isolation is improved with a counterbore 202 on the backing plate 205. The counterbore 202 decreases the backing plate's stiffness, which transmits less stress to the Silicon die 206.

Figure 3:
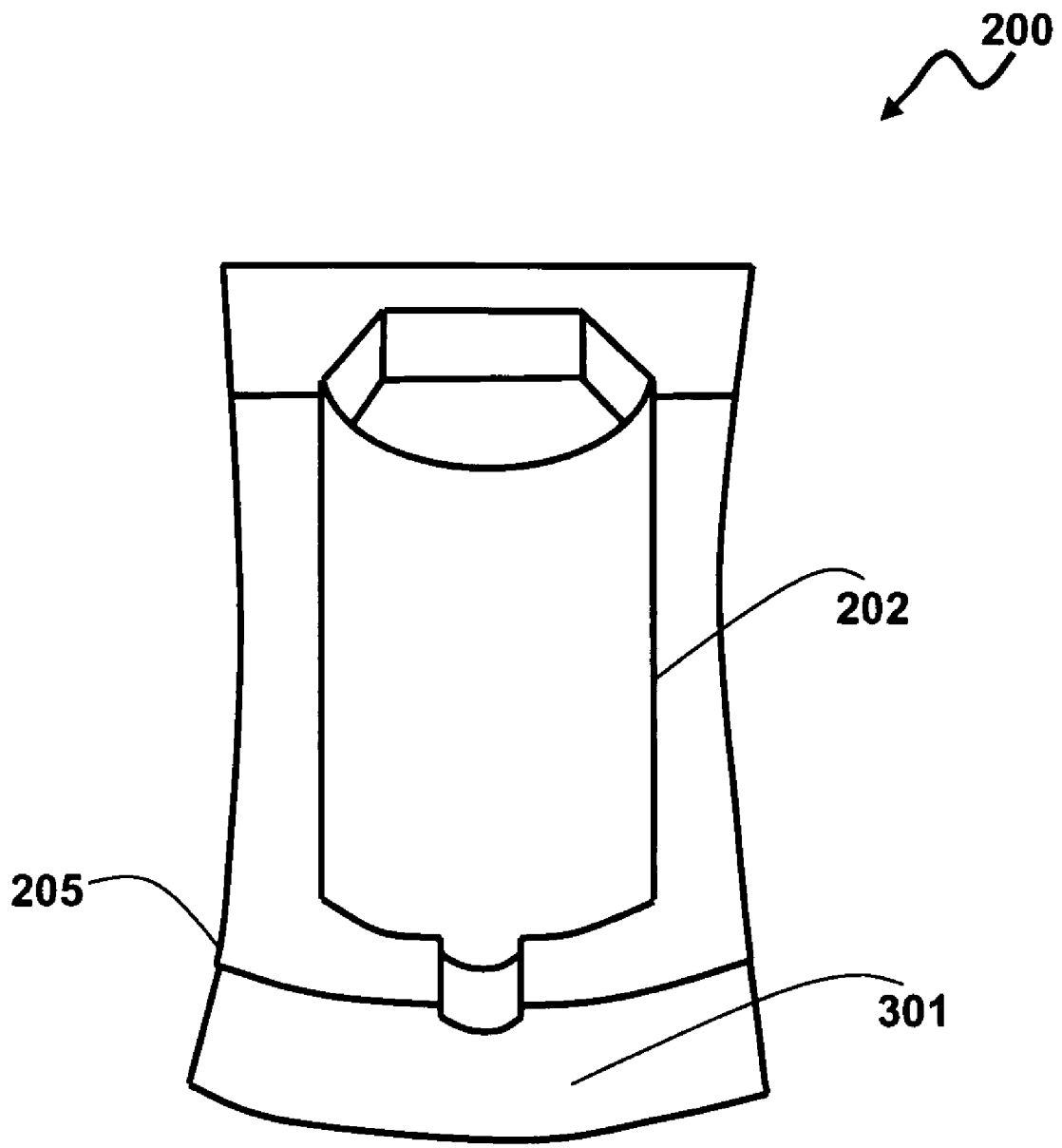
FIG. 3 illustrates a perspective view of a pressure sensor depicting bending of backing plate and absorbing of the stress produced at the die/package interface, which can be implemented in accordance with a preferred embodiment.

FIG. 3 illustrates a perspective view of a pressure sensor 200 depicting bending of backing plate 205 and absorbing of the stress produced at the die/package (not shown) interface 203 depicted in FIG. 2, which can be implemented in accordance with a preferred embodiment. FIG. 3 shows the strain on the pressure die produced when the sensor is heated from room temperature to 185 degree Celsius. Note that in FIG. 2 and FIG. 3, identical or similar parts or elements are indicated by identical reference numerals. Thus, FIG. 3 also contains the counterbore 202 and backing plate 205. The counterbore 202 decreases the stiffness of the backing plate 205. A less rigid backing plate 205 bends and absorbs the stress produced at the die/package (not shown) interface 203. Counterbore 202 isolate the Silicon die 206 depicted in FIG. 2 from the package 204 depicted in FIG. 2 without making the backing plate thicker. This provides another way to modify the backing plate 205 so it can fit inside of the package 204. The cost of the backing plate 205 can also be reduced as the thickness increases cost. Counterbore 202 also allows for a large contact area between the pressure sensor 200 and the package 204. A larger contact area 301 provides a stronger bond with the package 204 making it possible to apply a larger pressure to the pressure sensor 200.

Figure 4:
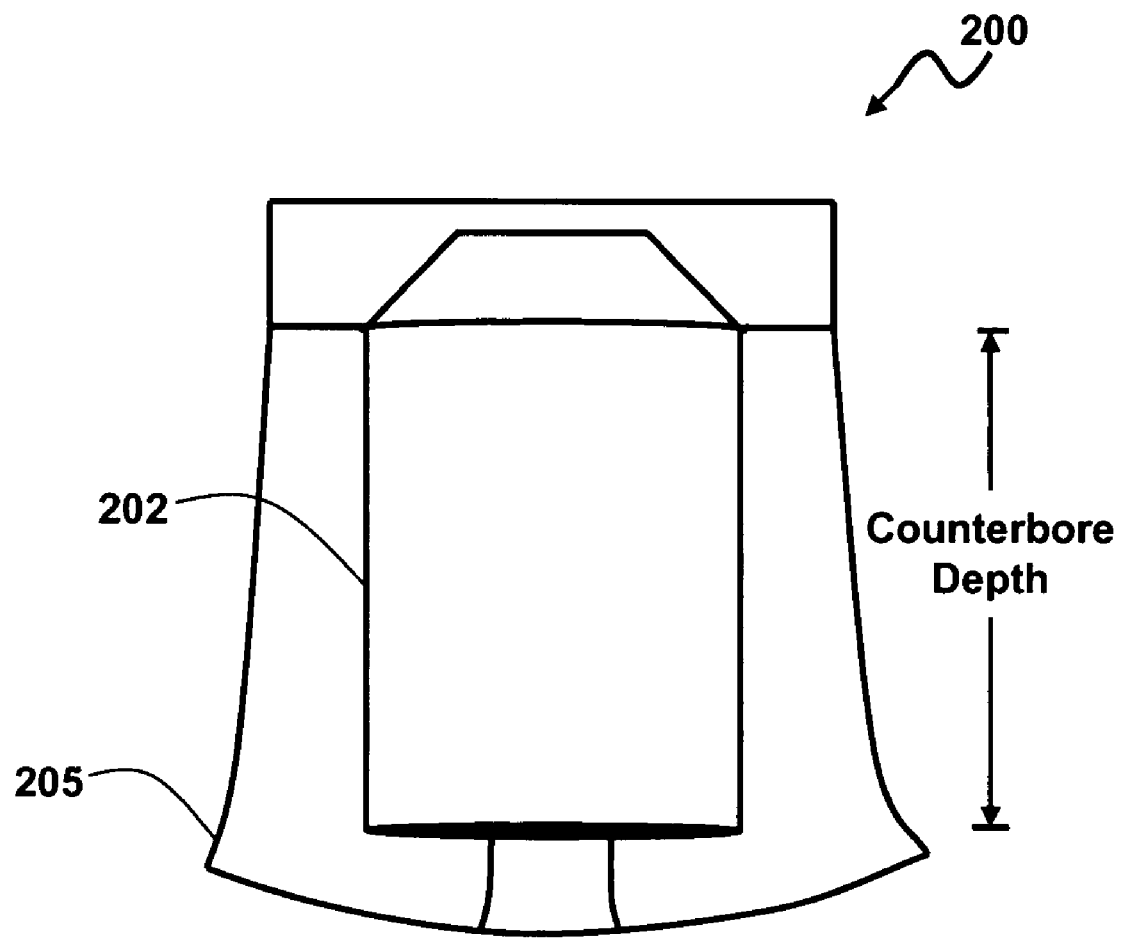
FIG. 4 illustrates a perspective view of a pressure sensor depicting counterbore depth, which can be implemented in accordance with a preferred embodiment.

Referring to FIG. 4 illustrates a perspective view of a pressure sensor 200 depicting counterbore depth, which can be implemented in accordance with a preferred embodiment. Note that in FIGS. 3 and 4, identical or similar parts or elements are indicated by identical reference numerals. Thus, FIG. 4 also contains the counterbore 202 and backing plate 205.

Figure 5:
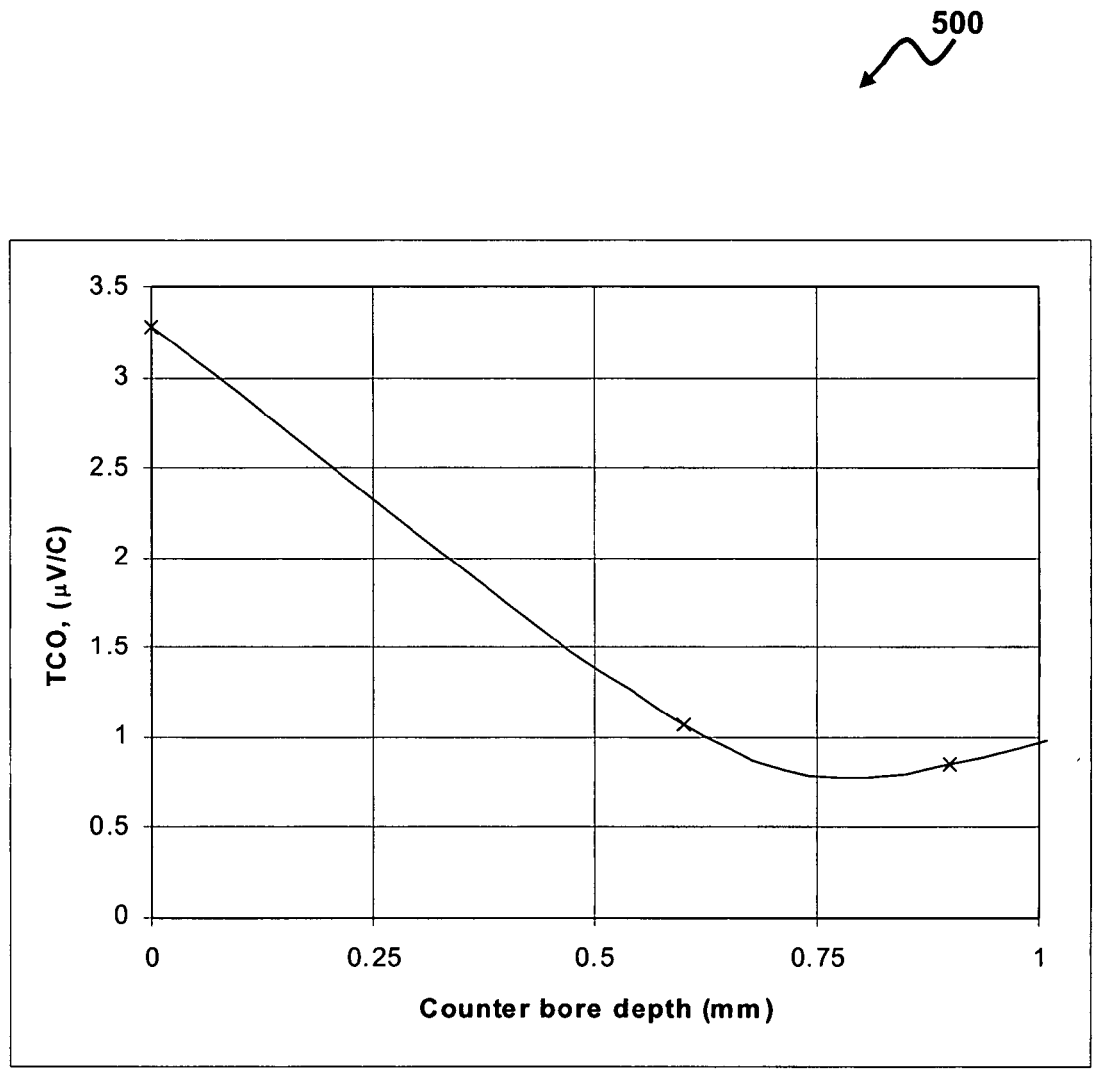
FIG. 5 illustrates a graph depicting variation of TCO with respect to counterbore depth, which can be implemented in accordance with a preferred embodiment.

FIG. 5 illustrates a graph 500 depicting variation of TCO with respect to counterbore depth, which can be implemented in accordance with a preferred embodiment. As seen in the graph 500 the counterbore 202 depicted in FIG. 2 can be modified to minimize the TCO. For example the TCO was decreased by factor of 4 by using the counterbore 202. The depth and diameter of the counterbore 202 can be adjusted to find the backing plate's geometry that minimizes the TCO.

Figure 6:
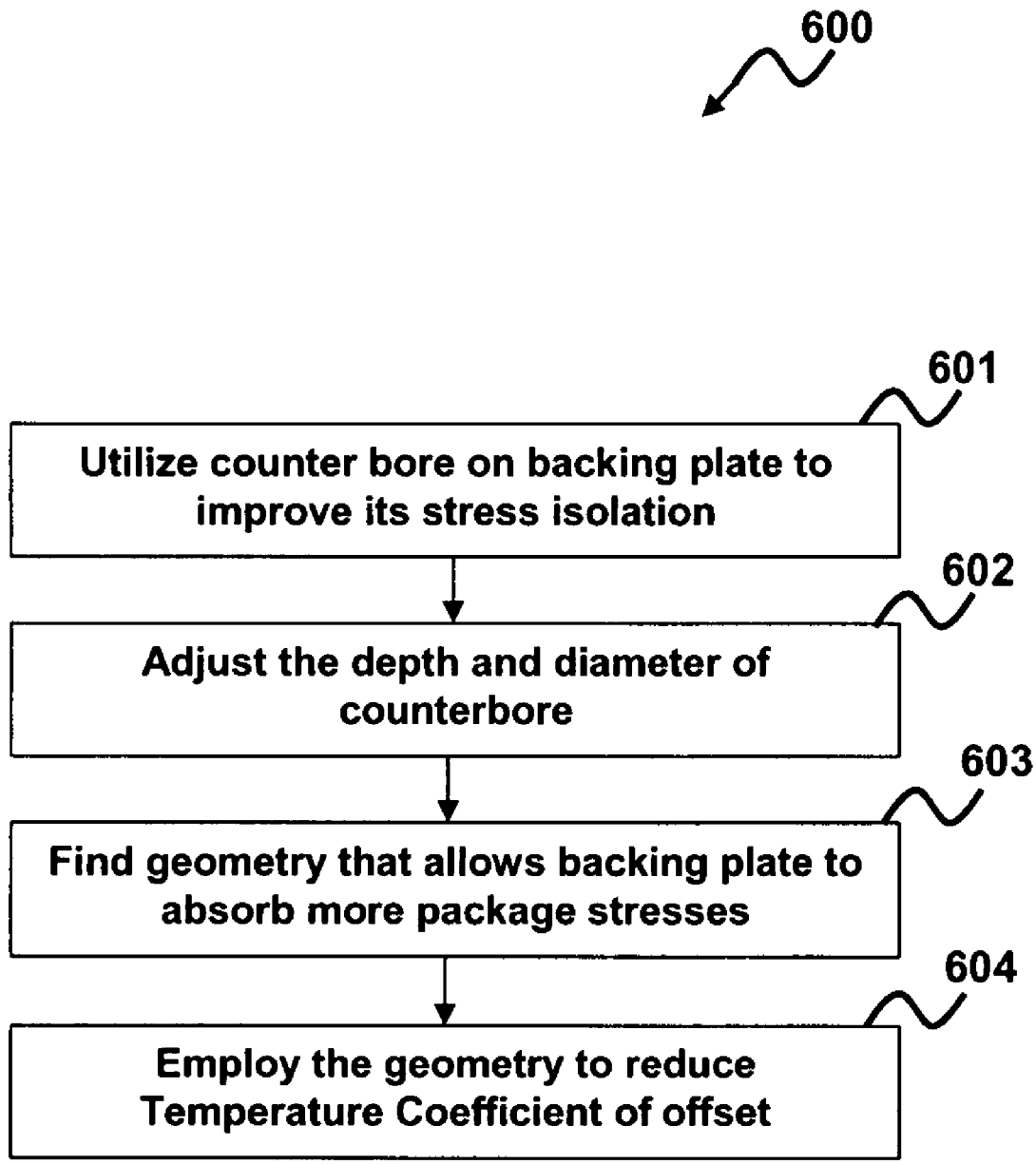
FIG. 6 illustrates a high level flow chart depicting the process of reducing TCO utilizing counterbore, in accordance with an alternate embodiment.

FIG. 6 illustrates a high level flow chart 600 depicting the process of reducing TCO with a counterbore 202, in accordance with a preferred embodiment. As depicted at block 601, the counterbore 202 can be employed on backing plate 205 to improve stress isolation. Next as described at block 602, the depth and diameter of counterbore 202 can be adjusted. Thereafter, as indicated at block 603, the geometry allowing backing plate 205 to absorb more package stresses can be found. Next, as depicted at block 604, the geometry can be employed to reduce temperature coefficient of offset on pressure sensor 200.

A backing plate with a counterbore can be used for stress isolation on a pressure sensor, an accelerometer or any MEMS device that is sensitive to package stresses.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for improving package stress isolation in a sensor package, comprising:
   providing a counterbore formed on a backing plate to improve stress isolation of said backing plate, wherein said counterbore decreases a stiffness of said backing plate;
   adjusting a depth and a diameter of said counterbore to find a geometry that allows said backing plate to absorb more package stresses; and
   employing said geometry to reduce a Temperature Coefficient of Offset (TCO) on said backing plate.

2. The method of claim 1 wherein said backing plate bends and absorbs a stress produced between a die and a package.

3. The method of claim 1 wherein said backing plate comprises a material having a coefficient of thermal expansion (CTE) close to silicon and wherein said backing plate is positioned between a package and a die to help isolate said die from package stresses.

4. The method of claim 1 wherein said backing plate includes one or more of the following: silicon, Pyrex Hoya, and Borofloat.

5. The method of claim 1 wherein said counterbore formed in said backing plate provides increased contact area between said backing plate and a package.

6. The method of claim 5 wherein said increased contact area provides a strong bond with said package.

7. A system for improving package stress isolation in a sensor package, comprising: a counterbore formed on a backing plate, wherein said counterbore is adapted to decrease a stiffness of said backing plate, and wherein said counterbore employs a geometry that reduces a Temperature Coefficient of Offset (TCO) on said backing plate.

8. The system for improving package stress isolation in a sensor package of claim 7 wherein said counterbore is configured to be formed to include a depth and a diameter to provide a geometry that enables said backing plate to absorb more package stresses.

9. The system for improving package stress isolation in a sensor package of claim 7 wherein said backing plate is configured to be bent and absorb a stress between a die and a package.

10. The system for improving package stress isolation in a sensor package of claim 7 wherein said backing plate is comprised of materials having a coefficient of thermal expansion (CTE) at or close to silicon and wherein said backing plate is positioned between a package and a die to isolate said die from stresses in said package.

11. The system for improving package stress isolation in a sensor package of claim 7 wherein said backing plate is comprised of at least one of silicon, Pyrex, Hoya, and Borofloat.

12. The system for improving package stress isolation in a sensor package of claim 7 wherein said counterbore formed on said backing plate is configured to provide a relatively large contact area between said backing plate and a package.

13. The system for improving package stress isolation in a sensor package of claim 12 wherein said relatively large contact area provides a stronger bond with said package.

\* \* \* \* \*